(12) United States Patent
Zhang et al.

(10) Patent No.: US 11,948,946 B2
(45) Date of Patent: Apr. 2, 2024

(54) ARRAY SUBSTRATE, METHOD FOR MANUFACTURING THE SAME, AND DISPLAY PANEL

(71) Applicants: Beihai HKC Optoelectronics Technology Co., Ltd., Beihai (CN); HKC Corporation Limited, Guangdong (CN)

(72) Inventors: Hejing Zhang, Beihai (CN); Zhen Liu, Beihai (CN); Jie Zhang, Beihai (CN); Je-hao Hsu, Beihai (CN); Haoxuan Zheng, Beihai (CN)

(73) Assignees: BEIHAI HKC OPTOELECTRONICS TECHNOLOGY CO., LTD., Beihai (CN); HKC CORPORATION LIMITED, Guangdong (CN)

( * ) Notice: Subject to any disclaimer, the term of this patent is extended or adjusted under 35 U.S.C. 154(b) by 17 days.

(21) Appl. No.: 18/090,109

(22) Filed: Dec. 28, 2022

(65) Prior Publication Data
US 2023/0369346 A1   Nov. 16, 2023

(30) Foreign Application Priority Data

May 12, 2022   (CN) .......................... 202210514714.9

(51) Int. Cl.
*H01L 27/12* (2006.01)
*G02F 1/1362* (2006.01)

(52) U.S. Cl.
CPC ...... *H01L 27/124* (2013.01); *G02F 1/136286* (2013.01); *H01L 27/127* (2013.01)

(58) Field of Classification Search
CPC ............. G02F 1/136286; H01L 27/124; H01L 27/127
(Continued)

(56) References Cited

U.S. PATENT DOCUMENTS

2020/0098792 A1   3/2020   He

FOREIGN PATENT DOCUMENTS

| CN | 101170085 A |   | 4/2008 |   |   |
|---|---|---|---|---|---|
| CN | 102254861 A | * | 11/2011 | ....... | H01L 21/32139 |

(Continued)

OTHER PUBLICATIONS

First Office Action dated Feb. 12, 2023 received in Chinese Patent Application No. CN 202210514714.9.

*Primary Examiner* — Alexander P Gross
*Assistant Examiner* — William D Peterson
(74) *Attorney, Agent, or Firm* — Scully, Scott, Murphy & Presser, P.C.

(57) ABSTRACT

An array substrate, a method for manufacturing the array substrate, and a display panel are provided in the disclosure. The method for manufacturing the array substrate includes the following. A gate and a signal trace spaced apart from the gate are formed on a substrate. A gate insulation layer is formed on the substrate. An active layer to-be-processed is formed on the gate insulation layer. A first photoresist layer is formed on the active layer to-be-processed. The active layer to-be-processed is etched to form an active layer, where the first photoresist layer is on a side surface of the active layer away from the gate insulation layer. A second photoresist layer is formed on the gate insulation layer. The gate insulation layer is etched to define a through hole, where the through hole faces the signal trace.

20 Claims, 13 Drawing Sheets

(58) Field of Classification Search
USPC .......................................................... 349/33
See application file for complete search history.

(56)         References Cited

FOREIGN PATENT DOCUMENTS

| CN | 102254861 A |   | 11/2011 |
|----|-------------|---|---------|
| CN | 106887405 A | * | 6/2017  |
| CN | 106887405 A |   | 6/2017  |
| CN | 112951853 A |   | 6/2021  |

* cited by examiner

ARRAY SUBSTRATE, METHOD FOR MANUFACTURING THE SAME, AND DISPLAY PANEL

CROSS-REFERENCE TO RELATED APPLICATIONS

This application claims priority under 35 U.S.C. § 119(a) to Chinese Patent Application No. 202210514714.9, filed May 12, 2022, the entire disclosure of which is incorporated herein by reference.

TECHNICAL FIELD

This disclosure relates to the technology field of display devices, and particularly to an array substrate, a method for manufacturing the array substrate, and a display panel.

BACKGROUND

With increasing diversities of active display panels in driving form, a gate insulation layer needs to be patterned again after patterning an active layer. However, due to the additional patterning process of the gate insulation layer, a surface of the active layer will be subjected to processes such as photo and stripping twice, thereby making the surface of the active layer more oxidized or damaged, affecting electrical performance of a Thin Film Transistor (TFT), and thus affecting performance of the array substrate and degrading display performance of the display panel.

SUMMARY

A method for manufacturing an array substrate is provided in embodiments of the disclosure, so that an active layer of the array substrate is not easy to be oxidized.

In a first aspect of the disclosure, a method for manufacturing an array substrate is provided, and includes the following. A gate and a signal trace spaced apart from the gate are formed on a substrate. A gate insulation layer is formed on the substrate, where the gate insulation layer covers the gate and the signal trace. An active layer to-be-processed is formed on the gate insulation layer. A first photoresist layer to-be-processed is formed on the active layer to-be-processed, and the first photoresist layer to-be-processed is exposed and developed to form a first photoresist layer. The active layer to-be-processed is etched to form an active layer, where the first photoresist layer is on a side surface of the active layer away from the gate insulation layer. A second photoresist layer to-be-processed is formed on the gate insulation layer, where the second photoresist layer to-be-processed is connected with the first photoresist layer. The second photoresist layer to-be-processed is exposed and developed to form a second photoresist layer. The gate insulation layer is etched to define a through hole, where the through hole faces the signal trace. The first photoresist layer and the second photoresist layer are removed. A source and a drain are formed on the gate insulation layer, where one of the source or the drain is connected with the signal trace through the through hole.

In a possible embodiment, the second photoresist layer to-be-processed is coated on the gate insulation layer with a coating speed less than or equal to 180 mm/s.

In a possible embodiment, the gate and the signal trace spaced apart from the gate are formed on the substrate as follows. A first metal layer to-be-processed is formed on the substrate. A photoresist layer to-be-processed is formed on the first metal layer to-be-processed, and the photoresist layer to-be-processed is exposed and developed to form a photoresist layer. The first metal layer to-be-processed is etched to form a first metal layer, where part of the first metal layer serves as the gate, and the rest of the first metal layer serves as the signal trace. The photoresist layer is removed.

In a possible embodiment, the source and the drain are formed on the gate insulation layer as follows. A second metal layer to-be-processed is formed on the gate insulation layer, where the second metal layer to-be-processed covers the active layer. A photoresist layer to-be-processed is formed on the second metal layer to-be-processed, and the photoresist layer to-be-processed is exposed and developed to form a photoresist layer. The second metal layer to-be-processed is etched to form a second metal layer, where part of the second metal layer serves as the source, and the rest of the second metal layer serves as the drain. The photoresist layer is removed.

In a possible embodiment, the method further includes the following after the source and the drain are formed on the gate insulation layer, where one of the source or the drain is connected with the signal trace through the through hole. A passivation layer is formed on the gate insulation layer, where the passivation layer covers the active layer, the source, and the drain.

In a second aspect of the disclosure, a method for manufacturing an array substrate is provided, and includes the following. A first gate and a second gate spaced apart from the first gate are formed on a substrate. A gate insulation layer is formed on the substrate, where the gate insulation layer covers the first gate and the second gate. An active layer to-be-processed is formed on the gate insulation layer. A first photoresist layer to-be-processed is formed on the active layer to-be-processed, and the first photoresist layer to-be-processed is exposed and developed to form a first photoresist layer. The active layer to-be-processed is etched to form a first active layer and a second active layer, where part of the first photoresist layer is on a side surface of the first active layer away from the gate insulation layer, and the rest of the first photoresist layer is on a side surface of the second active layer away from the gate insulation layer. A second photoresist layer to-be-processed is formed on the gate insulation layer, where the second photoresist layer to-be-processed is connected with the first photoresist layer. The second photoresist layer to-be-processed is exposed and developed to form a second photoresist layer. The gate insulation layer is etched to define a through hole, where the through hole faces the second gate. The first photoresist layer and the second photoresist layer are removed. A first source, a first drain, a second source, and a second drain are formed on the gate insulation layer, where one of the first source or the first drain is connected with the second gate through the through hole.

In a possible embodiment, the second photoresist layer to-be-processed covers the first photoresist layer.

In a possible embodiment, the second photoresist layer to-be-processed is coated on the gate insulation layer with a coating speed less than or equal to 180 mm/s.

In a third aspect of the disclosure, an array substrate is provided. The array substrate is manufactured according to any one of the above methods.

In a fourth aspect of the disclosure, a display panel is provided. The display panel includes the above array substrate.

It can be understood that, after the active layer is formed, the first photoresist layer on the active layer is reserved, the second photoresist layer is directly formed, and the gate insulation layer is etched to form the through hole. Finally, the first photoresist layer and the second photoresist layer are stripped together, instead of first removing the first photoresist layer, then coating the second photoresist layer, and then removing the second photoresist layer. In this way, on the one hand, the first photoresist layer reserved on the active layer can protect the active layer, thereby avoiding a prolonged exposure of the active layer to ambience such as air, stripping solution, and water, where the prolonged exposure to the above ambience will cause oxidization of a surface of the active layer and damage of the active layer in structure, thus cause a greater impedance at a region where the active layer and the source connect and a greater impedance at a region where the active layer and the drain connect, and in turn adversely affect electrical performance of the TFT. In the other hand, the surface of the active layer is subjected to a process of removing the photoresist layer only once (that is, the first photoresist layer is removed from the surface of the active layer), thereby avoiding the surface of the active layer from an excessive damage due to being subjected to a photoresist removal process twice.

Meanwhile, one photoresist removal process is omitted, a manufacturing process of the array substrate is accelerated without increasing process difficulty. Moreover, after the first photoresist layer and the second photoresist layer are removed to expose both the active layer and the signal trace, the source and the drain can be connected to the active layer and the signal trace, thereby avoiding the active layer and the signal trace from oxidation due to a prolonged exposure to air.

BRIEF DESCRIPTION OF THE DRAWINGS

In order to describe technical solutions in embodiments of the disclosure or the related art more clearly, the following will give a brief introduction to accompanying drawings used for describing embodiments or the related art. Apparently, the accompanying drawings hereinafter described are merely some embodiments of the disclosure. Based on these drawings, those of ordinary skill in the art can also obtain other drawings without creative effort.

DETAILED DESCRIPTION

Technical solutions in embodiments of the disclosure will be described clearly and comprehensively below with reference to the accompanying drawings in embodiments of the disclosure. Apparently, embodiments described herein are merely some embodiments, rather than all embodiments, of the disclosure. Based on embodiments of the disclosure, all other embodiments obtained by those of ordinary skill in the art without creative effort shall fall within the protection scope of the disclosure.

Unless otherwise defined, all technical and scientific terms used herein have the same meaning as commonly understood by one of ordinary skill in the technical field to which the disclosure belongs. The terms used herein are only for describing the purpose of embodiments of the disclosure, and are not intended to limit the disclosure.

It should be noted that, when one element is referred to as being "coupled" or "connected" to another element, it can be directly coupled or connected to the other element or intervening elements may also be present. A and/or B include three options, including only A, including only B, and including both A and B, respectively.

The following will describe specific embodiments of the disclosure in detail with reference to the accompanying figures.

Figure 1:
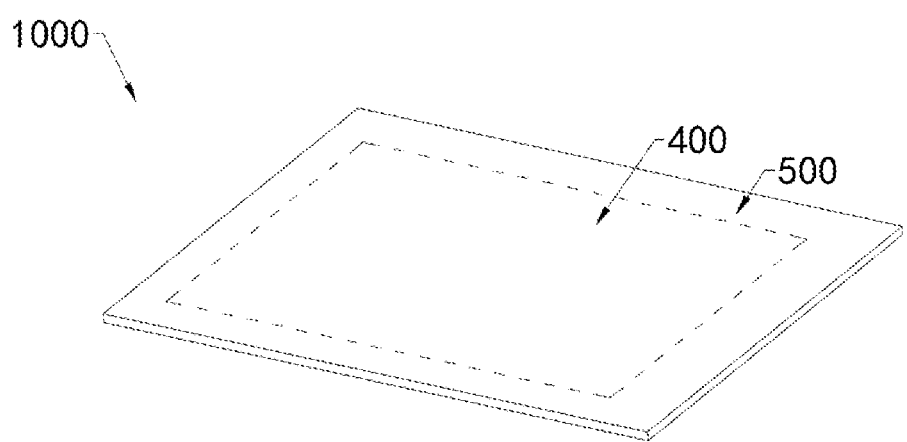
FIG. 1 is a schematic structural view of a display panel provided in the disclosure.

Referring to FIG. 1, FIG. 1 is a schematic structural view of a display panel 1000 provided in the disclosure. The display panel 1000 may be an Organic Light-Emitting Diode (OLED) display panel, a Liquid Crystal Display (LCD), a Mini Light-Emitting Diode (LED) display panel, or a Micro LED display panel, etc. The Micro LED display panel is taken as an example of the display panel 1000 illustrated in FIG. 1.

Figure 2:
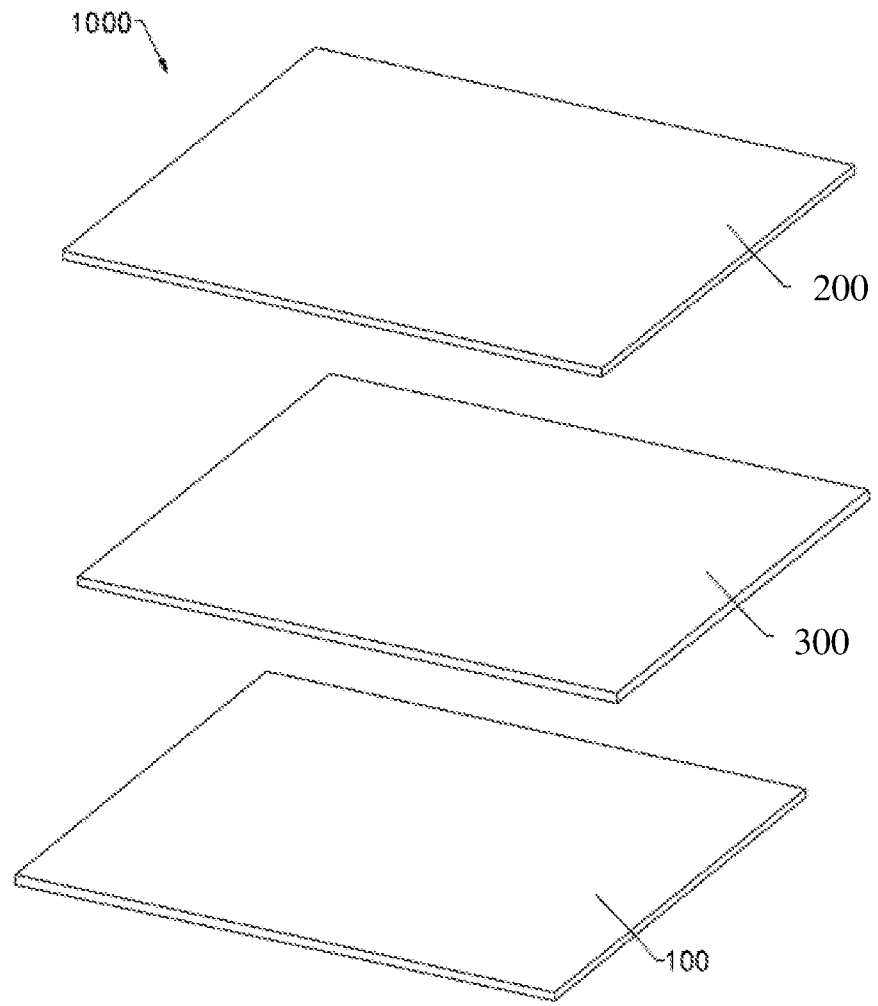
FIG. 2 is an exploded schematic structural view of a display panel provided in the disclosure.

Referring to FIG. 2, FIG. 2 is an exploded schematic structural view of a display panel 1000 provided in the disclosure. The display panel 1000 includes an array substrate 100, a color film substrate 200, and a liquid crystal layer 300. The array substrate 100 is a Thin Film Transistor (TFT) array substrate. The color film substrate 200 is a Color Filter (CF) substrate. The liquid crystal layer 300 is sandwiched between the array substrate 100 and the color film substrate 200.

Referring to FIG. 1 again, the display panel 1000 includes a display region 400 and a non-display region 500. The display region 400 is configured for image display. The non-display region 500 is around the display region 400. Part of the display panel 1000 in the display region 400 can control deflecting directions of liquid crystals of the liquid crystal layer 300 in the display region 400. Part of the color film substrate 200 in the display region 400 can filter light. The array substrate 100, the color film substrate 200, and the liquid crystal layer 300 cooperatively realize image display in the display region 400.

In an embodiment, referring to FIG. 3 to FIG. 17, FIG. 3 is a flow chart illustrating a method for manufacturing an array substrate 100 provided in the embodiment. FIGS. 4 to 17 each illustrate a cross-sectional structural view of part of an array substrate 100 in each of various manufacturing operations of the method illustrated FIG. 3. The method for manufacturing the array substrate 100 is provided in the disclosure, and begins with operations at block 101.

Figure 4:
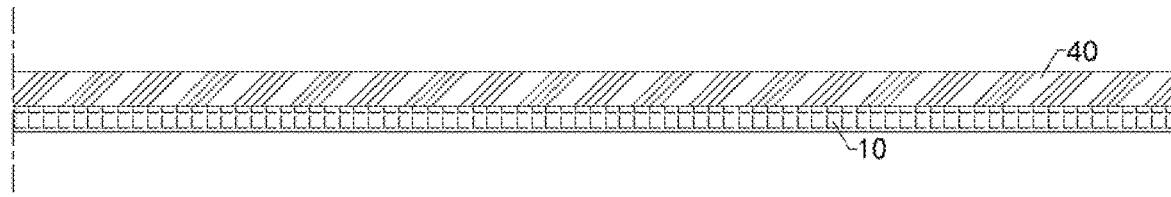
FIGS. 4 to 17 each illustrate a cross-sectional structural view of part of an array substrate in each of various manufacturing operations of the method illustrated in FIG. 3.
Figure 5:
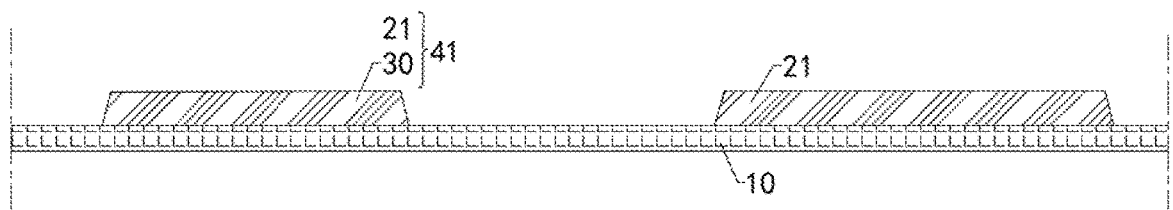

Referring to FIG. 4 and FIG. 5, at block 101, a gate 21 and a signal trace 30 spaced apart from the gate 21 are formed on a substrate 10.

In an embodiment, a first metal layer to-be-processed 40 is formed on the substrate 10. A photoresist layer to-be-processed is formed on the first metal layer to-be-processed 40, and the photoresist layer to-be-processed is exposed and developed to form a photoresist layer. The first metal layer to-be-processed 40 is etched to form a first metal layer 41, where part of the first metal layer 41 serves as the gate 21 of a TFT 20, and the rest of the first metal layer 41 serves as the signal trace 30. The photoresist layer formed in the above operation is removed.

In the embodiment, the substrate 10 is made of transparent glass, so that the substrate 10 has a high hardness. In other embodiments, the substrate 10 may be made of quartz.

The first metal layer to-be-processed 40 may be made of a single metal such as Aluminum-Neodymium alloy (AlNd), Aluminum (Al), Cuprum (Cu), and Molybdenum (Mo), or may be made of a composite metal composed of any combination of AlNd, Al, Cu, or Mo.

Figure 6:
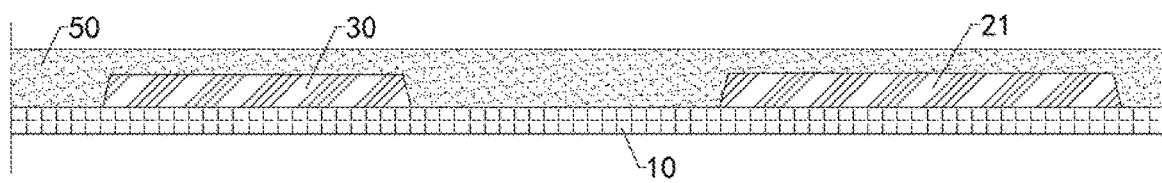

Referring to FIG. 6, at block 102, a gate insulation layer 50 is formed on the substrate 10, where the gate insulation layer 50 covers the gate 21 and the signal trace 30. The gate insulation layer 50 may be made of one or more of silicon nitride, silicon oxide, or silicon oxynitride.

Figure 7:
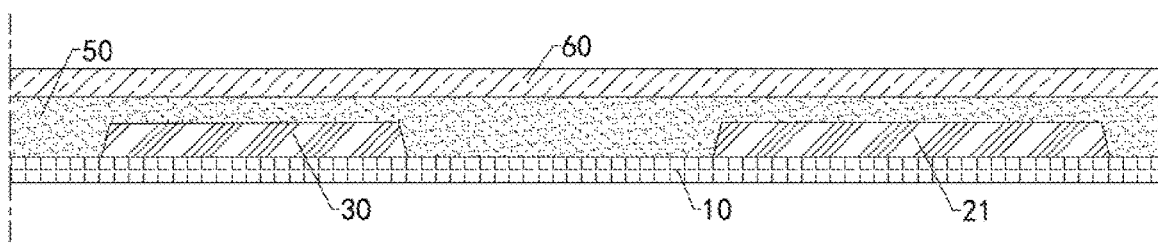

Referring to FIG. 7, at block 103, an active layer to-be-processed 60 is formed on the gate insulation layer 50. The active layer to-be-processed 60 may be on a side surface of the gate insulation layer 50 away from the substrate 10. In an embodiment, the active layer to-be-processed 60 may be made of Indium Gallium Zinc Oxide (IGZO).

Figure 8:
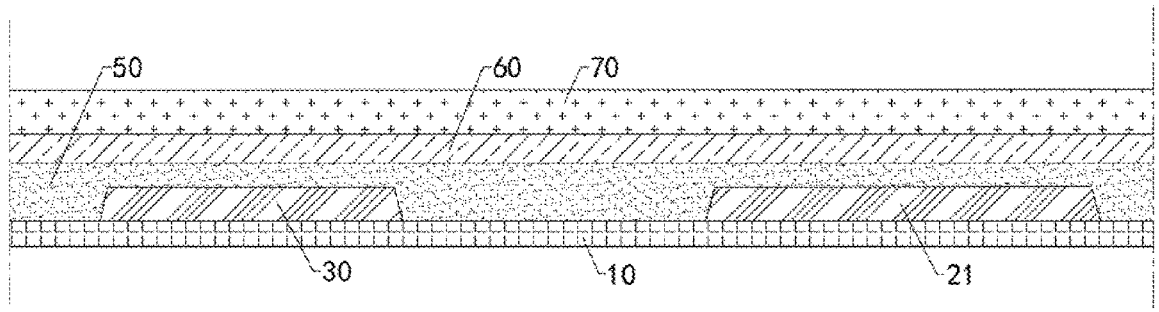
Figure 9:
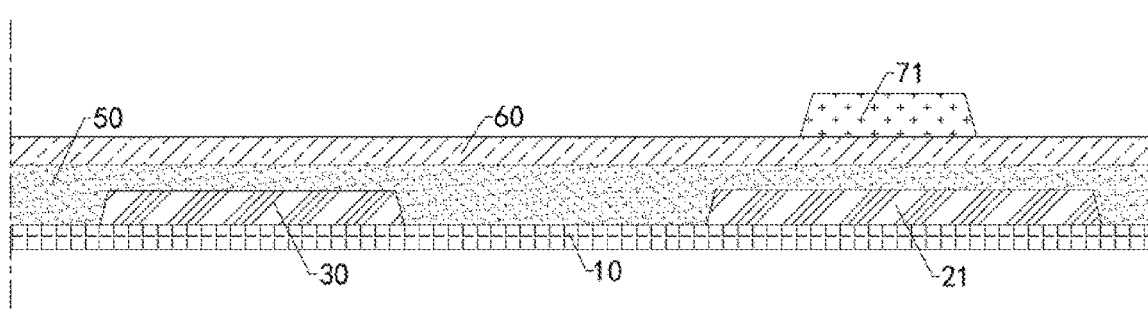

Referring to FIG. 8 and FIG. 9, at block 104, a first photoresist layer to-be-processed 70 is formed on the active layer to-be-processed 60, and the first photoresist layer to-be-processed 70 is exposed and developed to form a first photoresist layer 71.

Specifically, the first photoresist layer to-be-processed 70 is formed on a side surface of the active layer to-be-processed 60 away from the substrate 10, and the first photoresist layer to-be-processed 70 is exposed to form a first photoresist layer 71.

Figure 10:
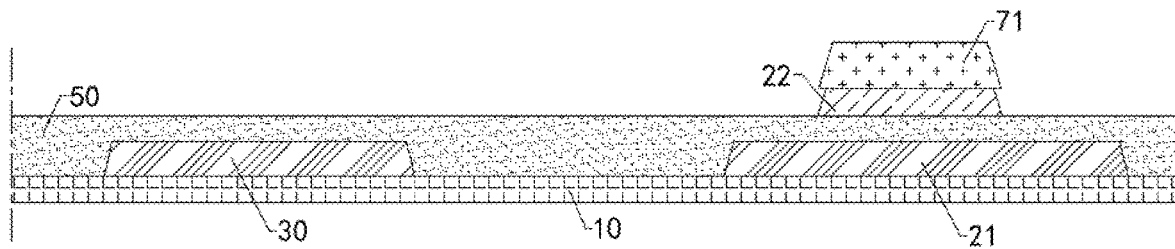

Referring to FIG. 10, at block 105, the active layer to-be-processed 60 is etched to form an active layer 22, where the first photoresist layer 71 is on a side surface of the active layer 22 away from the gate insulation layer 50. In this way, in a subsequent process(es), the first photoresist layer 71 can protect the active layer 22, thereby preventing the side surface of the active layer 22 away from the substrate 10 from being exposed to air or cleaning solution for a long time, preventing the active layer 22 from being over oxidized, and ensuring good electrical performance of the TFT 20.

Figure 11:
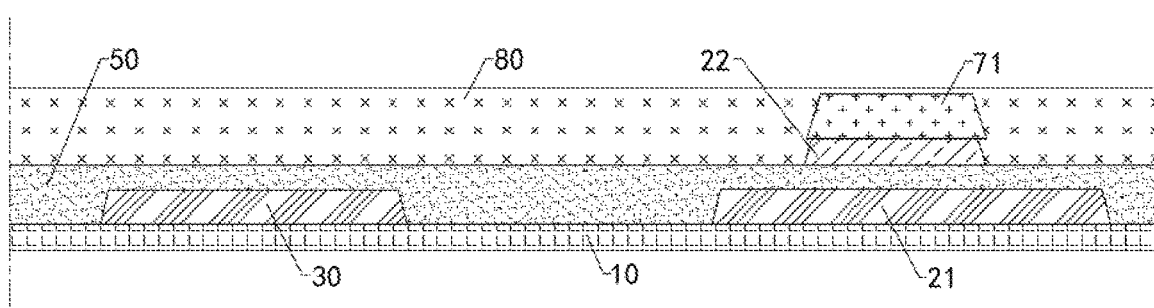

Referring to FIG. 11, at block 106, a second photoresist layer to-be-processed 80 is formed on the gate insulation layer 50, where the second photoresist layer to-be-processed 80 is connected with the first photoresist layer 71.

Figure 12:
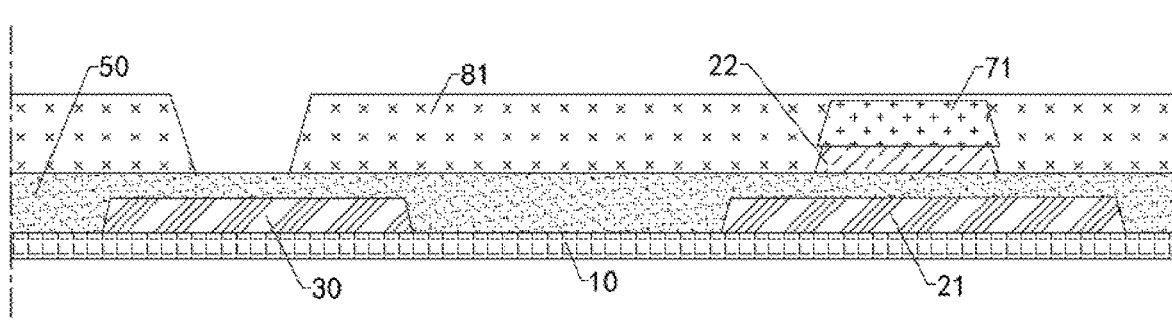

Referring to FIG. 12, at block 107, the second photoresist layer to-be-processed 80 is exposed and developed to form a second photoresist layer 81.

Figure 13:
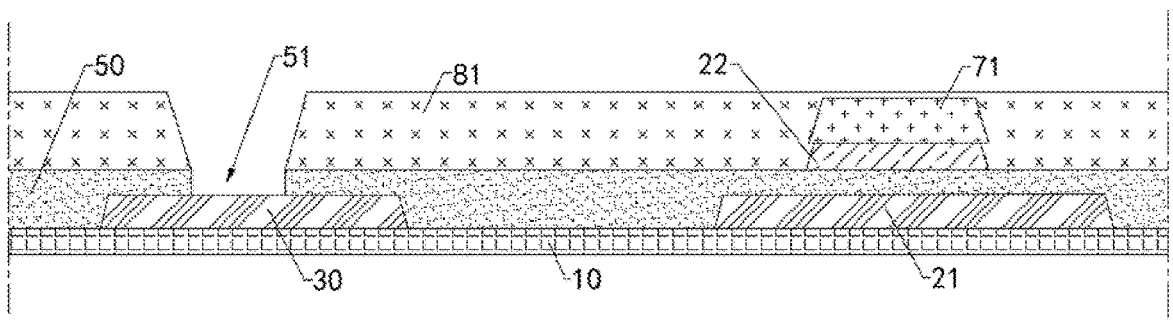

Referring to FIG. 13, at block 108, the gate insulation layer 50 is etched to define a through hole 51, where the through hole 51 faces the signal trace 30. It can be understood that, with aid of the second photoresist layer 81, it is possible to define the through hole 51 in the gate insulation layer 50.

Figure 14:
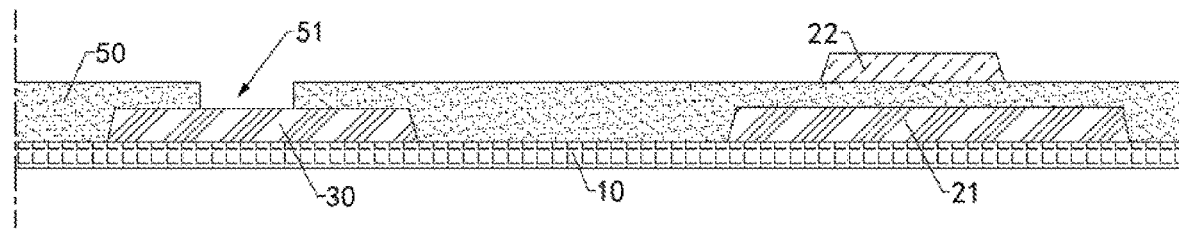

Referring to FIG. 14, at block 109, the first photoresist layer 71 and the second photoresist layer 81 are removed.

Figure 15:
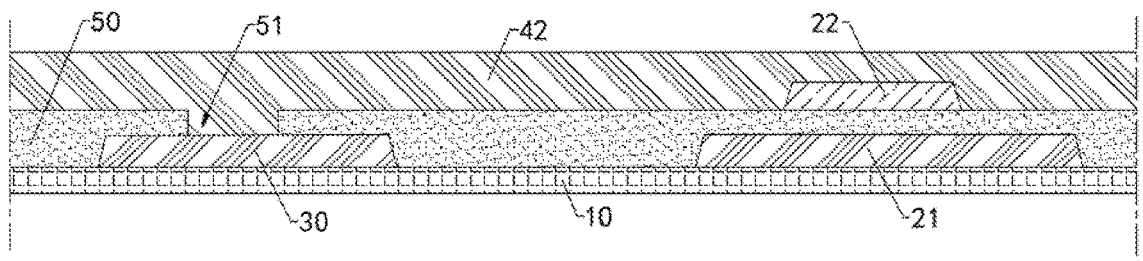
Figure 16:
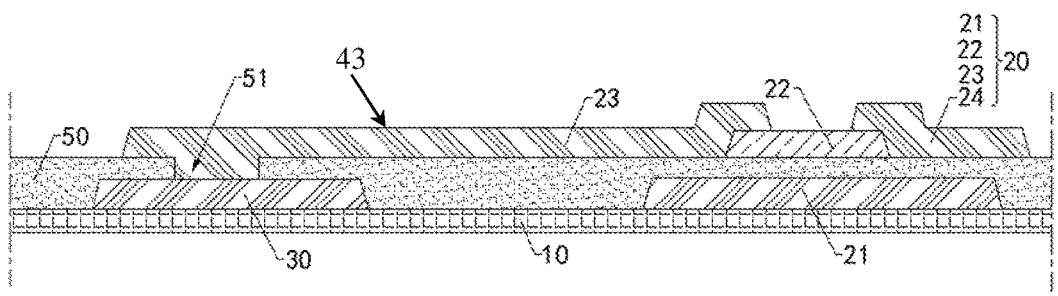

Referring to FIG. 15 and FIG. 16, at block 110, a source 23 and a drain 24 are formed on the gate insulation layer 50, where one of the source 23 or the drain 24 is connected with the signal trace 30 through the through hole 51.

In an embodiment, a second metal layer to-be-processed 42 is formed on the gate insulation layer 50, where the second metal layer to-be-processed 42 covers the active layer 22 and the through hole 51. A photoresist layer to-be-processed is formed on the second metal layer to-be-processed 42, and the photoresist layer to-be-processed is exposed and developed to form a photoresist layer. The second metal layer to-be-processed 42 is etched to form a second metal layer 43, where part of the second metal layer 43 serves as the source 23, and the rest of the second metal layer 43 serves as the drain 24. The photoresist layer formed in the above operation is removed.

With the above operations, the TFT 20 and the signal trace 30 are eventually formed on the substrate 10. The TFT 20 is configured to control crystal deflection of the liquid crystal layer 300, and the signal trace 30 is configured to transmit signals to the TFT 20. The TFT 20 includes the gate 21, the active layer 22, the source 23, and the drain 24. Through defining a through hole in the gate insulation layer 50, one of the source 23 or the drain 24 of the TFT 20 can be connected with the signal trace 30 through the through hole 51. Meanwhile, since both the source 23 and the drain 24 are made of a conductive material (s), one of the source 23 or the drain 24 can be electrically connected with the signal trace 30 through the through hole 51.

In the embodiment, the source 23 is connected with the signal trace 30 through the through hole 51. In other embodiments, the drain 24 can be connected with the signal trace 30 through the through hole 51. The signal trace 30 may include one or more of a data Line, a gate line, or a voltage transmission line (Vint line), which is not limited herein. The signal trace 30 may further include other lines for transmitting signals which are necessary for display.

It can be understood that, in the above operations, after the active layer 22 is formed, the first photoresist layer 71 on the active layer 22 is reserved, the second photoresist layer 81 is directly formed, and the gate insulation layer 50 is etched to form the through hole 51. Finally, the first photoresist layer 71 and the second photoresist layer 81 are stripped together, instead of first removing the first photoresist layer 71, then coating the second photoresist layer 81, and then removing the second photoresist layer 81. In this way, on the one hand, the first photoresist layer 71 reserved on the active layer 22 can protect the active layer 22, thereby avoiding a prolonged exposure of the active layer 22 to air, stripping solution, water and other environments for a longer time, where the prolonged exposure to air will cause oxidization of a surface of the active layer 22 and damage of the active layer 22 in structure, thus cause a greater impedance at a region where the active layer 22 and the source 23 connect and impedance at a region where the active layer 22 and the drain 24 connect, and in turn adversely affect electrical performance of the TFT 20. In the other hand, the surface of the active layer 22 is subjected to a process of removing the photoresist layer only once (that is, the first photoresist layer 71 is removed from the surface of the active layer 22), thereby avoiding the surface of the active layer 22 from an excessive damage due to being subjected to a photoresist removal process twice. Meanwhile, one photoresist removal process is omitted, a manufacturing process of the array substrate 100 is accelerated without increasing process difficulty. Moreover, after the first photoresist layer 71 and the second photoresist layer 81 are removed to expose both the active layer 22 and the signal trace 30, the source 23 and the drain 24 can be connected to the active layer 22 and the signal trace 30, thereby avoiding the active layer 22 and the signal trace 30 from oxidation due to a prolonged exposure to air.

In an embodiment, after operations at block 110, the method further includes the following.

Figure 17:
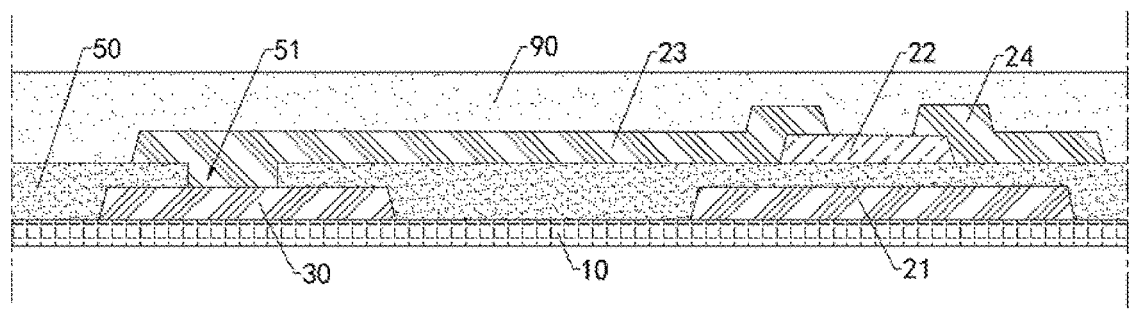

Referring to FIG. 17, at block 111, a passivation layer 90 is formed on the gate insulation layer 50, where the passivation layer 90 covers the active layer 22, the source 23, and the drain 24. The passivation layer 90 plays a protective and insulating role. In an embodiment, the passivation layer 90 may be implemented as multiple passivation layers.

It can be understood that, after operations at block 111, other structures may also be disposed on the passivation layer 90, other elements may be formed on the array substrate 100, which are not limited to the TFT 20 and the signal trace 30 in the embodiment. As such, an array substrate 100 with specific functions can be formed, and thus driving requirements of different display panels 1000 can be met.

In an embodiment, referring to FIG. 11 again, the second photoresist layer to-be-processed 80 formed at block 106 covers the first photoresist layer 71 formed at block 104. In this way, it is easier to realize the process, which is conducive to accelerating the manufacturing process.

In an embodiment, a thickness of the first photoresist layer 71 ranges from 1.0 μm to 2.5 μm. A thickness of the second photoresist layer 81 is greater than or equal to the thickness of the first photoresist layer 71, so that the second photoresist layer 81 can cover the first photoresist layer 71. In other embodiments, the second photoresist layer 81 may be disposed around the first photoresist layer 71, or may be spaced apart from the first photoresist layer 71.

In an embodiment, the second photoresist layer to-be-processed 80 is coated on the gate insulation layer 50 with a coating speed less than or equal to 180 mm/s. In this way, the first photoresist layer 71 may have no significant effects on the coating of the second photoresist layer to-be-processed 80, which is conducive to uniform coating of the second photoresist layer to-be-processed 80 on the gate insulation layer 50 and the first photoresist layer 71. Therefore, during subsequent stripping of the first photoresist layer 71 and the second photoresist layer 81, the active layer 22 can be prevented from being excessively etched and damaged due to non-uniform thickness of the second photoresist layer 81. In other embodiments, the coating speed of the second photoresist layer to-be-processed 80 may be greater than 180 mm/s.

In an embodiment, the first photoresist layer to-be-processed 70 and the second photoresist layer to-be-processed 80 are exposed through a photo process.

Figure 18:
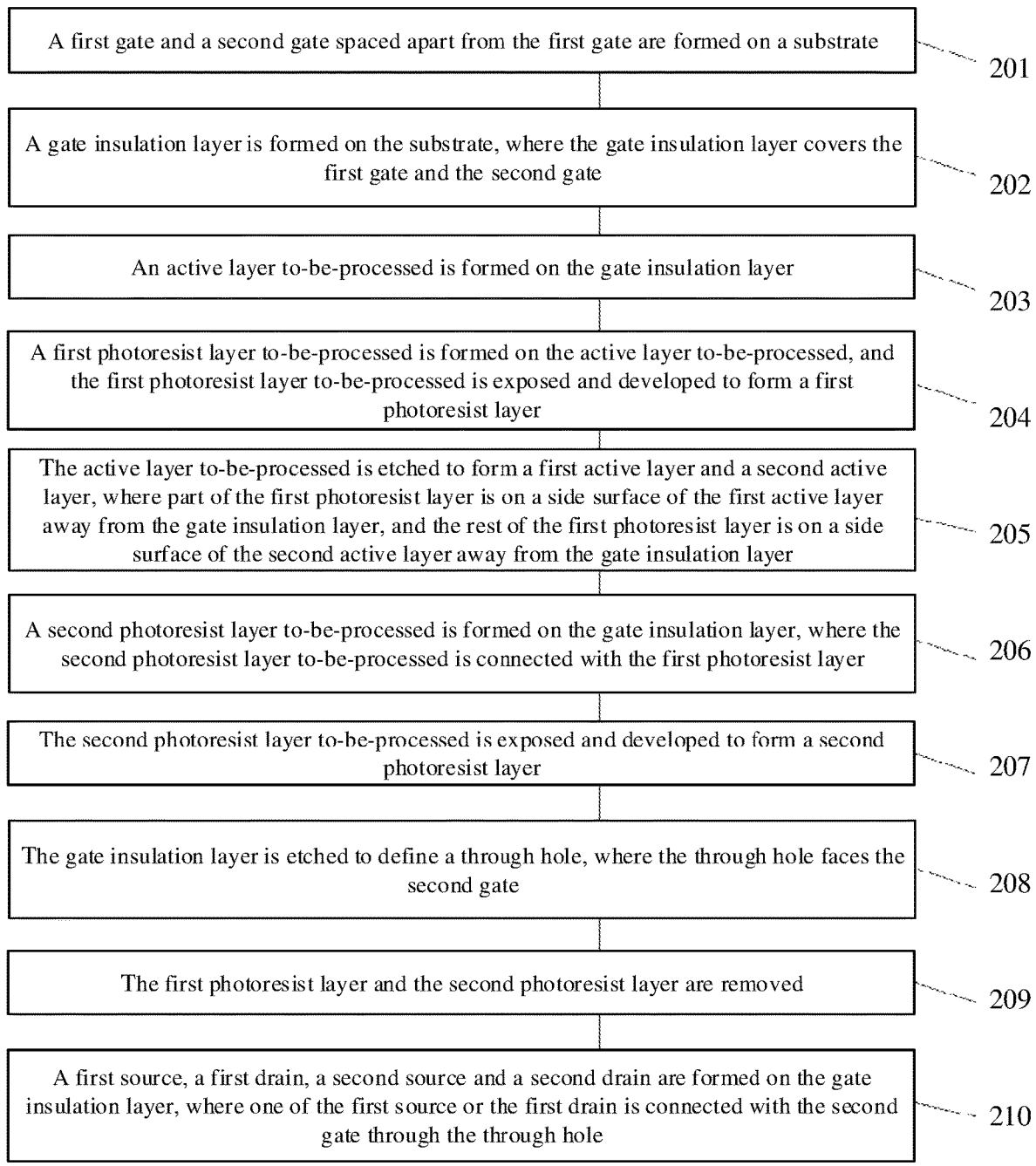
FIG. 18 is a flow chart illustrating a method for manufacturing an array substrate provided in an embodiment.

In an embodiment, referring to FIG. 18 to FIG. 32, FIG. 18 is a flow chart illustrating a method for manufacturing an array substrate 100 provided in the embodiment, FIGS. 19 to 32 each illustrate a cross-sectional structural view of part of an array substrate 100 in each of various manufacturing operations of the method illustrated in FIG. 18. The method illustrated in FIG. 18 is described below, technical contents which are the same as those in the method illustrated in FIG. 3 will not be repeated herein. The method for manufacturing the array substrate 100 provided in the embodiment includes the following.

Figure 19:
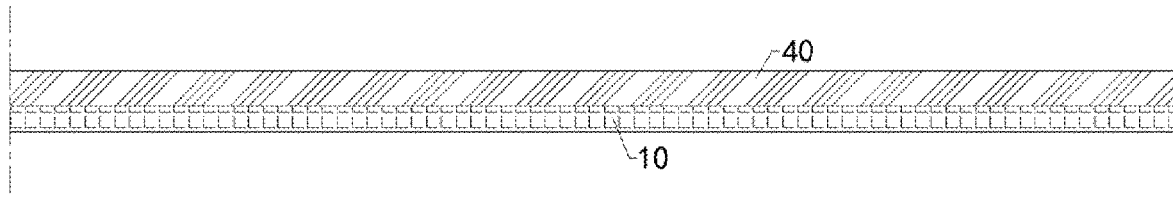
FIGS. 19 to 32 each illustrate a cross-sectional structural view of part of an array substrate in each of various manufacturing operations of the method illustrated in FIG. 18.
Figure 20:
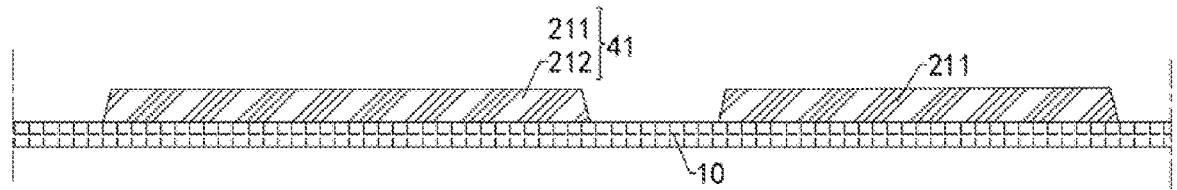

Referring to FIG. 19 to FIG. 20, at block 201, a first gate 211 and a second gate 212 spaced apart from the first gate 211 are formed on a substrate 10.

In an embodiment, a first metal layer to-be-processed 40 is formed on the substrate 10. A photoresist layer is formed on the first metal layer to-be-processed 40, and the photoresist layer is exposed and developed to form a patterned photoresist layer. The first metal layer to-be-processed 40 is etched to form a first metal layer 41, where part of the first metal layer 41 serves as the first gate 211, and the rest of the first metal layer 41 serves as the second gate 212. Finally, the patterned photoresist layer formed in the above operation is removed.

Figure 21:
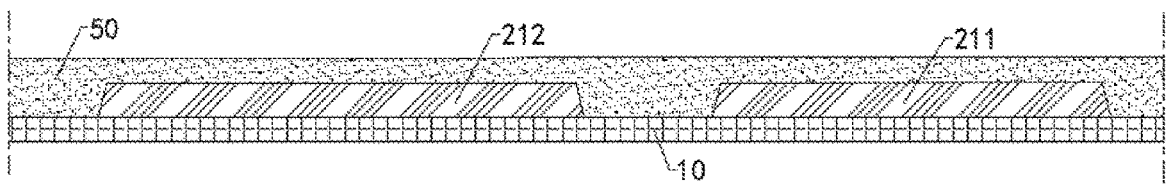

Referring to FIG. 21, at block 202, a gate insulation layer 50 is formed on the substrate 10, where the gate insulation layer 50 covers the first gate 211 and the second gate 212.

Figure 22:
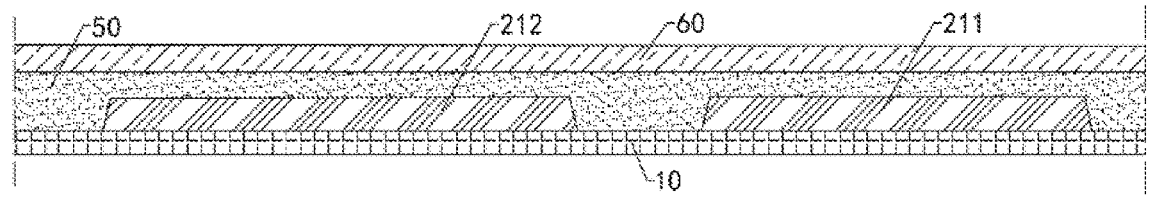

Referring to FIG. 22, at block 203, an active layer to-be-processed 60 is formed on the gate insulation layer 50. The active layer to-be-processed 60 may be on a side surface of the gate insulation layer 50 away from the substrate 10.

Figure 23:
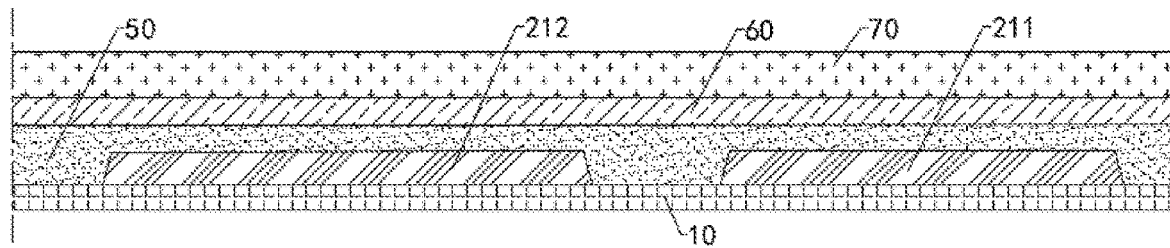
Figure 24:
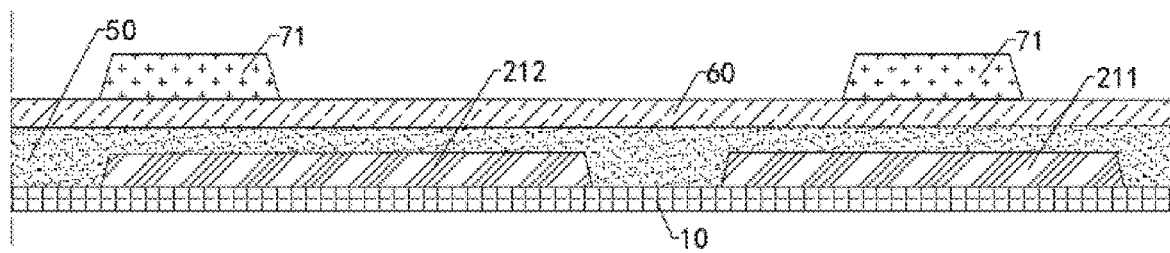

Referring to FIG. 23 and FIG. 24, at block 204, a first photoresist layer to-be-processed 70 is formed on the active layer to-be-processed 60, and the first photoresist layer to-be-processed 70 is exposed and developed to form a first photoresist layer 71.

Figure 25:
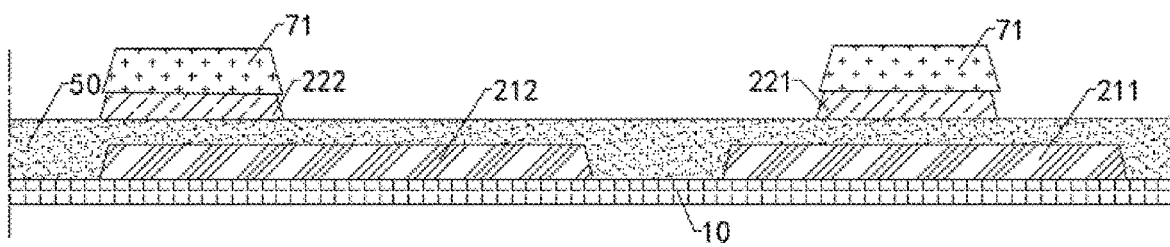

Referring to FIG. 25, at block 205, the active layer to-be-processed 60 is etched to form a first active layer 221 and a second active layer 222, where part of the first photoresist layer 71 is on a side surface of the first active layer 221 away from the gate insulation layer 50, and the rest of the first photoresist layer 71 is on a side surface of the second active layer 222 away from the gate insulation layer 50.

Figure 26:
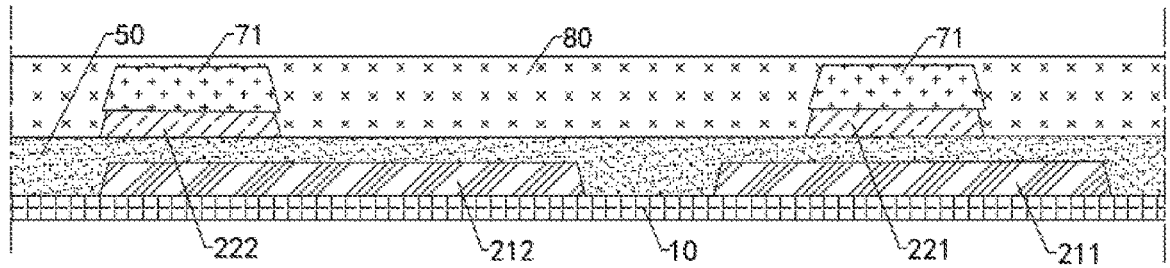

Referring to FIG. 26, at block 206, a second photoresist layer to-be-processed 80 is formed on the gate insulation layer 50, where the second photoresist layer to-be-processed 80 is connected with the first photoresist layer 71.

Figure 27:
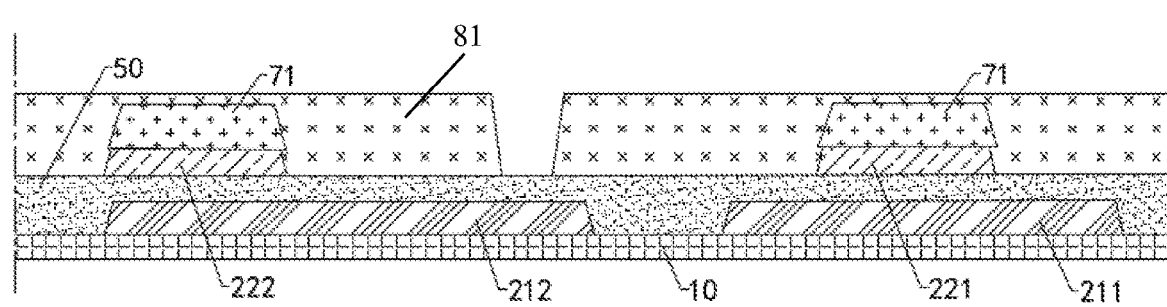

Referring to FIG. 27, at block 207, the second photoresist layer to-be-processed 80 is exposed and developed to form a second photoresist layer 81.

Figure 28:
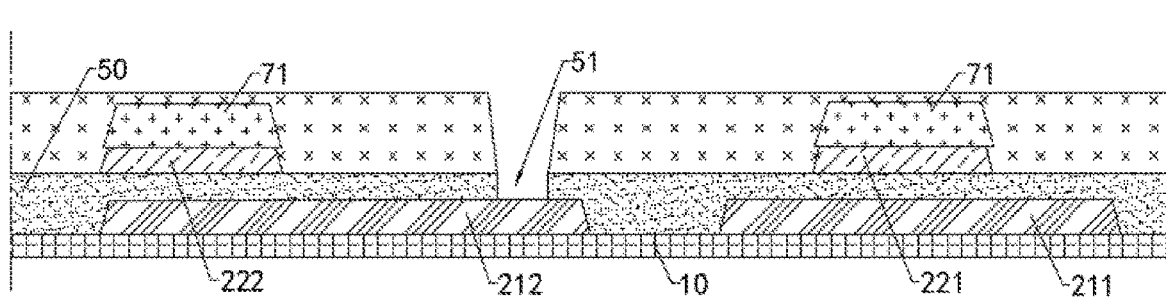

Referring to FIG. 28, at block 208, the gate insulation layer 50 is etched to define a through hole 51, where the through hole 51 faces the second gate 212.

Figure 29:
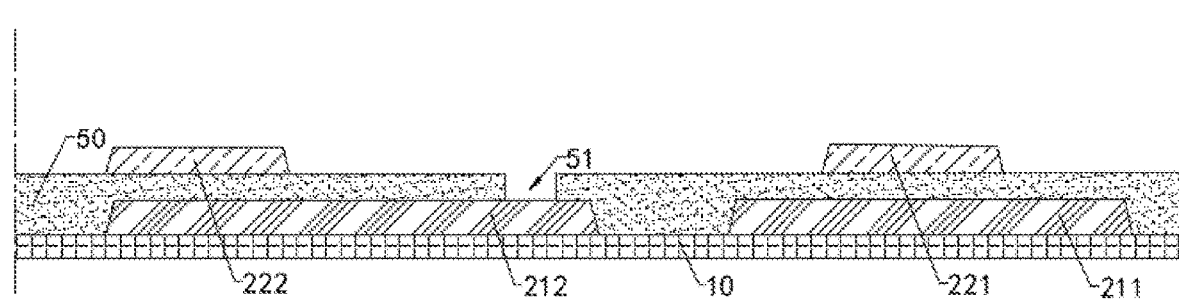

Referring to FIG. 29, at block 209, the first photoresist layer 71 and the second photoresist layer 81 are removed.

Figure 30:
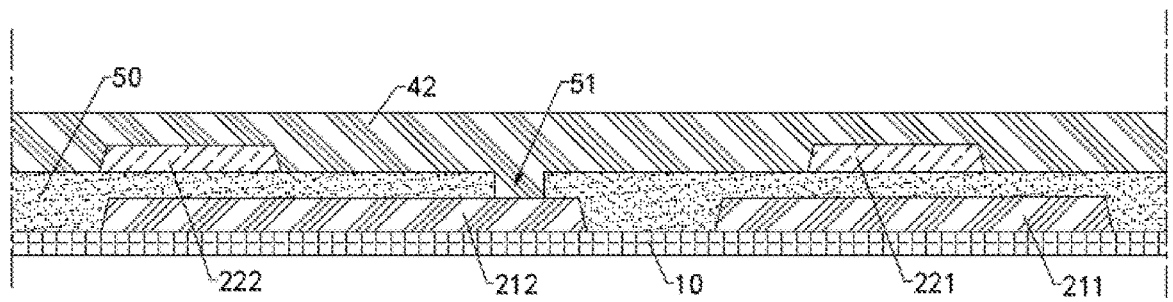
Figure 31:
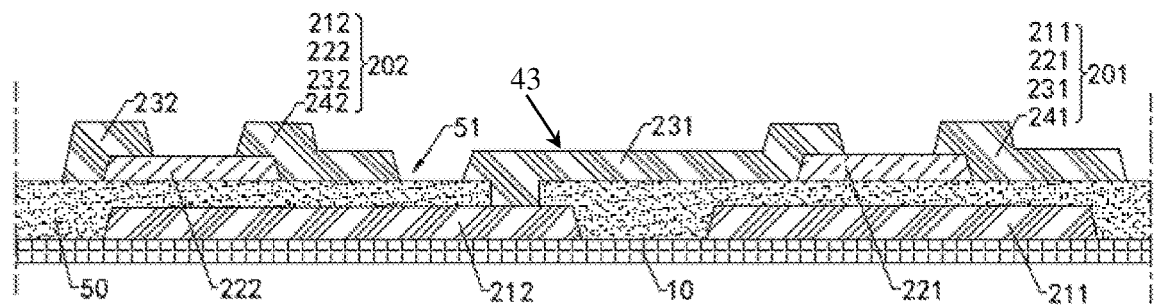

Referring to FIG. 30 and FIG. 31, at block 210, a first source 231, a first drain 241, a second source 232 and a second drain 242 are formed on the gate insulation layer 50, where one of the first source 231 or the first drain 241 is connected with the second gate 212 through the through hole 51.

In an embodiment, a second metal layer to-be-processed 42 is formed on the gate insulation layer 50, where the second metal layer to-be-processed 42 covers the active layer 22. Specifically, the second metal layer to-be-processed 42 is formed on the gate insulation layer 50, where the second metal layer to-be-processed 42 covers the first active layer 221 and the second active layer 222. A photoresist layer is formed on the second metal layer to-be-processed 42, and the photoresist layer is exposed and developed to form a patterned photoresist layer. The second metal layer to-be-processed 42 is etched to form a second metal layer 43, where part of the second metal layer 43 serves as the first source 231, part of the second metal layer 43 serves as the first drain 241, part of the second metal layer 43 serves as the second source 232, and the rest of the second metal layer 43 serves as the second drain 242. The patterned photoresist layer formed in the above operation is removed.

With the above operations, a first TFT 201 and a second TFT 202 are formed on the substrate 10. The first TFT 201 includes the first gate 211, the first active layer 221, the first drain 241, and the first source 231. The second TFT 202 includes the second gate 212, the second active layer 222, the second drain 242, and the second source 232. Through defining a through hole in the gate insulation layer 50, one of the first source 231 or the first drain 241 can be connected with the second gate 212 through the through hole 51. Meanwhile, since both the first source 231 and the first drain 241 are made of a conductive material (s), one of the first source 231 or the first drain 241 can be electrically connected with the signal trace 30 through the through hole 51. That is, the first source 231 or the first drain 241 of the first TFT 201 can be electrically connected with the second gate 212 of the second TFT 202 through the through hole 51 of the gate insulation layer 50, thereby realizing the connection between the first TFT 201 and the second TFT 202.

In the embodiment, the first source 231 is connected with the second gate 212 through the through hole 51. In other embodiments, the first drain 241 can be connected with the second gate 212 through the through hole 51.

In an embodiment, after operations at block 210, the method further includes the following.

Figure 32:
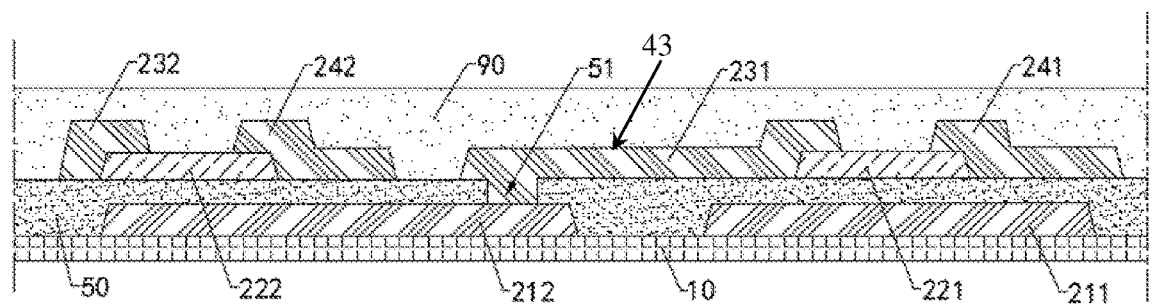

Referring to FIG. 32, at block 211, a passivation layer 90 is formed on the gate insulation layer 50, where the passivation layer 90 covers the active layer 22, the source 23, and the drain 24. Specifically, the passivation layer 90 is formed on the gate insulation layer 50, where the passivation layer 90 covers the first active layer 221, the second active layer 222, the first source 231, the second source 232, the first drain 241, and the second drain 242. The passivation layer 90 plays a protective and insulating role. In an embodiment, the passivation layer 90 may be implemented as multiple passivation layers.

It can be understood that, after operations at block 211, other structures may also be disposed on the passivation layer 90. As such, an array substrate 100 with specific functions can be formed, and thus driving requirements of different display panels 1000 can be met.

In an embodiment, the second photoresist layer to-be-processed 80 formed at block 206 covers the first photoresist layer 71 formed at block 204. In this way, it is easier to realize the process, which is conducive to accelerating the manufacturing process.

In an embodiment, a thickness of the first photoresist layer 71 ranges from 1.0 μm to 2.5 μm. A thickness of the second photoresist layer 81 is greater than or equal to the thickness of the first photoresist layer 71, so that the second photoresist layer 81 can cover the first photoresist layer 71. In other embodiments, the second photoresist layer 81 may be disposed around the first photoresist layer 71, or may be spaced apart from the first photoresist layer 71.

In an embodiment, the second photoresist layer to-be-processed 80 is coated on the gate insulation layer 50 with a coating speed less than or equal to 180 mm/s. In this way, the first photoresist layer 71 may have no significant effects on the coating of the second photoresist layer to-be-processed 80, which is conducive to uniform coating of the second photoresist layer to-be-processed 80 on the gate insulation layer 50 and the first photoresist layer 71. Therefore, during subsequent stripping of the first photoresist layer 71 and the second photoresist layer 81, the first active layer 221 and the second active layer 222 can be prevented from being excessively etched and damaged due to non-uniform thickness of the second photoresist layer 81. In other embodiments, the coating speed of the second photoresist layer to-be-processed 80 may be greater than 180 mm/s.

In an embodiment, at block 201, a signal trace 30 is further formed on the substrate 10, and is spaced apart from the first gate 211 and the second gate 212.

Figure 33:
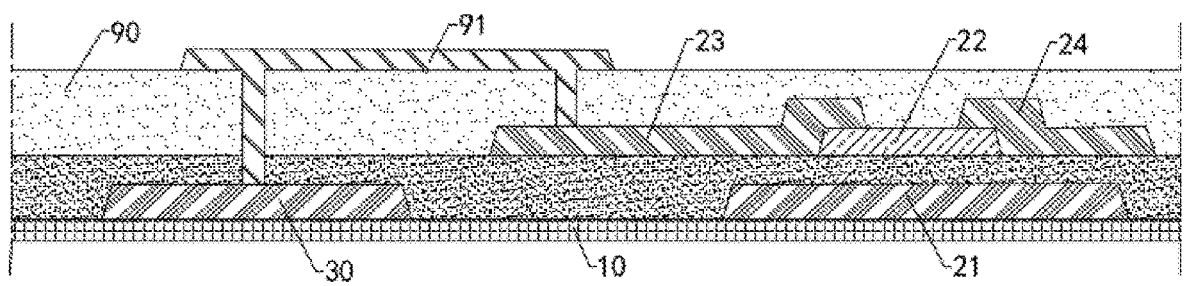
FIG. 33 is a schematic diagram illustrating a connection between a Thin Film Transistor (TFT) and a signal trace of a conventional array substrate.

Referring to FIG. 33, FIG. 33 is a schematic diagram illustrating a connection between a TFT 20 and a signal trace 30 of a conventional array substrate 100. In a conventional technical solution, a connecting member 91 is used to connect a source 23 of the TFT 20 and the signal trace 30, or to connect a drain 24 of the TFT 20 and the signal trace 30. However, a large arrangement space is required for such connection manner, therefore, electrical connections are usually disposed in the non-display region 500. The connecting member 91 may be made of Indium Tin Oxide (ITO).

Figure 3:
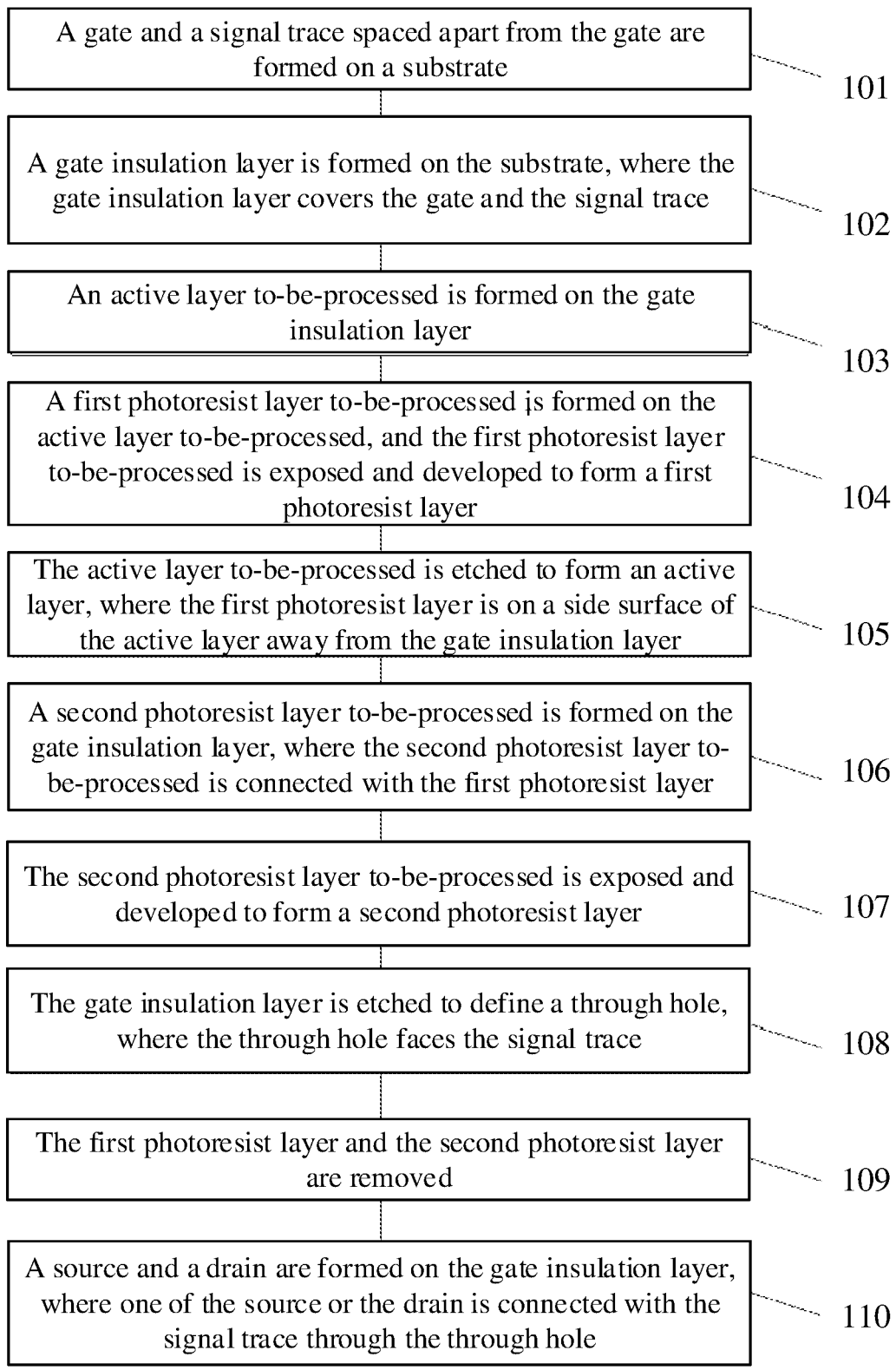
FIG. 3 is a flow chart illustrating a method for manufacturing an array substrate provided in an embodiment.

Referring to FIG. 17, one of the source 23 or the drain 24 of the array substrate 100 in the method illustrated in FIG. 3 is directly connected with the signal trace 30 through the through hole 51. On the one hand, the source 23 or the drain 24 in the method illustrated in FIG. 3 is directly connected with the signal trace 30, so that a signal transmission efficiency is improved. On the other hand, a small arrangement space is required in the disclosure, electrical connections can be realized in the display region 400, and thus arrangement of elements of the array substrate can be more compact, facilitating thinning of the display panel.

Similarly, referring to FIG. 32, in the method illustrated in FIG. 18, the first TFT 201 and the second TFT 202 can be directly connected in the display region 400. The first TFT 201 is directly connected with the second TFT 202, which can allow higher signal transmission efficiency. Furthermore, there is no need to dispose the connecting member 91 for connecting the first TFT 201 and the second TFT 202, and thus a space occupied by the connecting member 91 can be saved. Therefore, arrangement of elements of the array substrate 100 can be more compact, facilitating thinning of the display panel 1000.

In the disclosure, methods for manufacturing an array substrate 100 are described with reference to the accompanying drawings. It can be understood that, in each of the methods for manufacturing an array substrate 100, during formation of the TFT 20, the first photoresist layer 71 on the active layer is reserved, then the second photoresist layer 81 is directly formed, and the gate insulation layer 5 is etched to form the through hole 51. Finally, the first photoresist layer 71 and the second photoresist layer 81 are stripped together. In this way, on the one hand, the first photoresist layer 71 can protect the active layer from being corroded and damaged in subsequent processes. On the other hand, one additional photoresist removal process can be omitted, the manufacturing process can be accelerated. In addition, in the disclosure, original structures are reserved without adding new structures or new manufacturing processes, which will not increase the process difficulty.

In an embodiment, the method illustrated in FIG. 3 can be combined with the method illustrated in FIG. 18, that is, the array substrate formed in the method illustrated in FIG. 3 can be combined with the array substrate formed in the method illustrated in FIG. 18.

In an embodiment, a first TFT, a second TFT, a third TFT, and a signal trace are formed on the same array substrate, where a source or a drain of the first TFT is connected with a gate of the second TFT, and a source or a drain of the third TFT is connected with the signal trace.

In an embodiment, a first TFT, a second TFT, and a signal trace are formed on the same array substrate, where a source of the first TFT is connected with a gate of the second TFT, and a drain of the first TFT is connected with the signal trace. It can be understood that, those skilled in the art can electively set a direct connection between two TFTs or a direct connection between a TFT and a signal trace according to actual requirements, which are not limited in the disclosure.

While the disclosure has been described in detail above with reference to the exemplary embodiments, the scope of the disclosure is not limited thereto. As will occur to those skilled in the art, the disclosure is susceptible to various modifications and changes without departing from the scope of the disclosure. The embodiments in the disclosure as well as features in the embodiments can be combined with each other without inconsistency. Therefore, the scope of the disclosure should be determined by the scope of the claims.

What is claimed is:

1. A method for manufacturing an array substrate, comprising:
   forming on a substrate a gate and a signal trace spaced apart from the gate;
   forming on the substrate a gate insulation layer, the gate insulation layer covering the gate and the signal trace;
   forming on the gate insulation layer an active layer to-be-processed;
   forming on the active layer to-be-processed a first photoresist layer to-be-processed, and exposing and developing the first photoresist layer to-be-processed to form a first photoresist layer;
   etching the active layer to-be-processed to form an active layer, the first photoresist layer being on a side surface of the active layer away from the gate insulation layer;
   forming on the gate insulation layer a second photoresist layer to-be-processed, the second photoresist layer to-be-processed being connected with the first photoresist layer;
   exposing and developing the second photoresist layer to-be-processed to form a second photoresist layer;
   etching the gate insulation layer to define a through hole, the through hole facing the signal trace;
   removing the first photoresist layer and the second photoresist layer; and
   forming on the gate insulation layer a source and a drain, one of the source or the drain being connected with the signal trace through the through hole.

2. The method for manufacturing the array substrate of claim 1, wherein the second photoresist layer to-be-processed is coated on the gate insulation layer with a coating speed less than or equal to 180 mm/s.

3. The method for manufacturing the array substrate of claim 1, wherein forming on the substrate the gate and the signal trace spaced apart from the gate comprises:
   forming on the substrate a first metal layer to-be-processed;
   forming on the first metal layer to-be-processed a photoresist layer to-be-processed;
   exposing and developing the photoresist layer to-be-processed to form a photoresist layer;
   etching the first metal layer to-be-processed to form a first metal layer, part of the first metal layer serving as the gate, and the rest of the first metal layer serving as the signal trace; and
   removing the photoresist layer.

4. The method for manufacturing the array substrate of claim 2, wherein forming on the substrate the gate and the signal trace spaced apart from the gate comprises:
   forming on the substrate a first metal layer to-be-processed;
   forming on the first metal layer to-be-processed a photoresist layer to-be-processed;
   exposing and developing the photoresist layer to-be-processed to form a photoresist layer;
   etching the first metal layer to-be-processed to form a first metal layer, part of the first metal layer serving as the gate, and the rest of the first metal layer serving as the signal trace; and
   removing the photoresist layer.

5. The method for manufacturing the array substrate of claim 1, wherein forming on the gate insulation layer the source and the drain comprises:
   forming on the gate insulation layer a second metal layer to-be-processed, the second metal layer to-be-processed covering the active layer;
   forming on the second metal layer to-be-processed a photoresist layer to-be-processed;
   exposing and developing the photoresist layer to-be-processed to form a photoresist layer;
   etching the second metal layer to-be-processed to form a second metal layer, part of the second metal layer serving as the source, and the rest of the second metal layer serving as the drain; and
   removing the photoresist layer.

6. The method for manufacturing the array substrate of claim 2, wherein forming on the gate insulation layer the source and the drain comprises:
   forming on the gate insulation layer a second metal layer to-be-processed, the second metal layer to-be-processed covering the active layer;
   forming on the second metal layer to-be-processed a photoresist layer to-be-processed;
   exposing and developing the photoresist layer to-be-processed to form a photoresist layer;
   etching the second metal layer to-be-processed to form a second metal layer, part of the second metal layer serving as the source, and the rest of the second metal layer serving as the drain; and
   removing the photoresist layer.

7. The method for manufacturing the array substrate of claim 1, further comprising:
   after forming on the gate insulation layer the source and the drain, one of the source or the drain being connected with the signal trace through the through hole,
      forming on the gate insulation layer a passivation layer, the passivation layer covering the active layer, the source, and the drain.

8. The method for manufacturing the array substrate of claim 2, further comprising:
   after forming on the gate insulation layer the source and the drain, one of the source or the drain being connected with the signal trace through the through hole,
      forming on the gate insulation layer a passivation layer, the passivation layer covering the active layer, the source, and the drain.

9. A method for manufacturing an array substrate, comprising:
   forming on a substrate a first gate and a second gate spaced apart from the first gate;
   forming on the substrate a gate insulation layer, the gate insulation layer covering the first gate and the second gate;
   forming on the gate insulation layer an active layer to-be-processed;
   forming on the active layer to-be-processed a first photoresist layer to-be-processed;
   exposing and developing the first photoresist layer to-be-processed to form a first photoresist layer;
   etching the active layer to-be-processed to form a first active layer and a second active layer, part of the first photoresist layer being on a side surface of the first active layer away from the gate insulation layer, and the rest of the first photoresist layer being on a side surface of the second active layer away from the gate insulation layer;

forming on the gate insulation layer a second photoresist layer to-be-processed, the second photoresist layer to-be-processed being connected with the first photoresist layer;

exposing and developing the second photoresist layer to-be-processed to form a second photoresist layer;

etching the gate insulation layer to define a through hole, the through hole facing the second gate;

removing the first photoresist layer and the second photoresist layer; and forming on the gate insulation layer a first source, a first drain, a second source and a second drain, one of the first source or the first drain being connected with the second gate through the through hole.

10. The method for manufacturing the array substrate of claim 9, wherein the second photoresist layer to-be-processed covers the first photoresist layer.

11. The method for manufacturing the array substrate of claim 9, wherein the second photoresist layer to-be-processed is coated on the gate insulation layer with a coating speed less than or equal to 180 mm/s.

12. The method for manufacturing the array substrate of claim 10, wherein the second photoresist layer to-be-processed is coated on the gate insulation layer with a coating speed less than or equal to 180 mm/s.

13. An array substrate, the array substrate being manufactured through the method of claim 1.

14. The array substrate of claim 13, wherein the second photoresist layer to-be-processed is coated on the gate insulation layer with a coating speed less than or equal to 180 mm/s.

15. The array substrate of claim 13, wherein forming on the substrate the gate and the signal trace spaced apart from the gate comprises:

forming on the substrate a first metal layer to-be-processed;

forming on the first metal layer to-be-processed a photoresist layer to-be-processed;

exposing and developing the photoresist layer to-be-processed to form a photoresist layer;

etching the first metal layer to-be-processed to form a first metal layer, part of the first metal layer serving as the gate, and the rest of the first metal layer serving as the signal trace; and removing the photoresist layer.

16. The array substrate of claim 13, wherein forming on the gate insulation layer the source and the drain comprises:

forming on the gate insulation layer a second metal layer to-be-processed, the second metal layer to-be-processed covering the active layer;

forming on the second metal layer to-be-processed a photoresist layer to-be-processed;

exposing and developing the photoresist layer to-be-processed to form a photoresist layer;

etching the second metal layer to-be-processed to form a second metal layer, part of the second metal layer serving as the source, and the rest of the second metal layer serving as the drain; and removing the photoresist layer.

17. The array substrate of claim 13, further comprising:

after forming on the gate insulation layer the source and the drain, one of the source or the drain being connected with the signal trace through the through hole, forming on the gate insulation layer a passivation layer, the passivation layer covering the active layer, the source, and the drain.

18. A display panel, comprising an array substrate, a color film substrate, and a liquid crystal layer, the liquid crystal layer being sandwiched between the color film substrate and the array substrate, wherein the array substrate is manufactured through the method of claim 1.

19. The display panel of claim 18, wherein the second photoresist layer to-be-processed is coated on the gate insulation layer with a coating speed less than or equal to 180 mm/s.

20. The display panel of claim 18, wherein forming on the substrate the gate and the signal trace spaced apart from the gate comprises:

forming on the substrate a first metal layer to-be-processed;

forming on the first metal layer to-be-processed a photoresist layer to-be-processed;

exposing and developing the photoresist layer to-be-processed to form a photoresist layer;

etching the first metal layer to-be-processed to form a first metal layer, part of the first metal layer serving as the gate, and the rest of the first metal layer serving as the signal trace; and removing the photoresist layer.

* * * * *